LOW DISSIPATION LOGIC GATES

Filed Aug. 20, 1964 2 Sheets-Sheet 1

WITNESSES

Theodore F. Wrobel

James F. Young

INVENTORS
Roland Y. Hung
& Hung C. Lin

BY F. H. Henson

ATTORNEY

United States Patent Office 3,287,577
Patented Nov. 22, 1966

3,287,577

LOW DISSIPATION LOGIC GATES

Roland Y. Hung, Laurel, and Hung C. Lin, Silver Spring, Md., assignors to Westinghouse Electric Corporation, Pittsburgh, Pa., a corporation of Pennsylvania Filed Aug. 20, 1964, Ser. No. 390,788
21 Claims. (Cl. 307—88.5)

This invention in general relates to semiconductor logic circuits and, more particularly, to semiconductor logic circuits wherein power dissipation is of prime importance in the design of the circuits.

Logic gates for use in digital systems are generally designed for receiving a plurality of input signals from previous stages for developing output signals in response to the input signals, in order to drive one or more subsequent stages. The number of input signals received from previous stages is generally called the fan-in, and the number of subsequent stages to be driven is termed the fan-out. The gating circuits operate in an on-off mode representing for example binary ONE and binary ZERO information. The gates are connected to a source of operating potential through a load resistor and current will flow through the load resistor, to drive the semiconductor elements of a subsequent stage or stages. In order to have high fan-out capabilities it is desired that the driving current available from the gate be relatively high for various combinations of input signals, this driving current is not needed but the gates are so designed that available current flows through the load resistor to ground or a previous stage. This situation represents an unwanted power dissipation and power waste. With the advancement of microminiature and integrated circuitry wherein the semiconductor elements are formulated on a semiconductor wafer, the unwanted and excess power dissipation can cause excessive heating, tending to alter or destroy proper operation.

It is a primary object of the present invention to provide logic circuits operating with lower power dissipation than those of the prior art.

It is another object to provide logic circuits having increased fan-out capabilities.

Another object is to provide logic circuits wherein the relative speed of operation is increased.

It is a further object to provide logic circuits wherein current flow is substantially eliminated when not needed.

A further object of the present invention is to provide improved gating circuits with reduced power dissipation particularly well adapted to be formulated by integrated circuit methods.

Briefly, in accordance with the above objects, the broad concept of the invention comprises a logic gate having one or more input semiconductor devices each having an input electrode to which bivalued input signals are applied, and each having a like output electrode connected to a common point at which is developed bivalued signals in response to the input signals. The current voltage supply for the semiconductor devices is connected to the common point and includes a control device which will allow current flow when the voltage at the common point exceeds a certain value and will substantially eliminate current flow when the voltage is of a different value, to thereby eliminate an unwanted power dissipation when current is not needed and yet provide enough current for driving subsequent stages. The control circuit for achieving this operation includes a four region p-n-p-n type device having a first region operably connected to a source of operating potential for establishing a current path through the four regions, with one of the intermediate regions being connected to the common point and responsive to the voltage developed thereat for controlling conduction of the p-n-p-n device. In a preferred embodiment two transistors are operably connected to perform the four region function and includes two complementary transistors. The base of the first transistor is connected to the collector of the second transistor and the collector of the first transistor is connected to the base of the second respectively. In addition to the current path established from the emitter to collector of the second transistor, when the transistors are on, there is also a current path from the emitter to base of the second transistor which is in the collector to emitter circuit of the first transistor. Output means are connected to the common point for propagating output signals to subsequent stages.

The above-stated, as well as other objects, features and advantages of the invention will become apparent upon a reading of the following detailed specification taken in conjunction with the drawings, in which.

Figure 1:
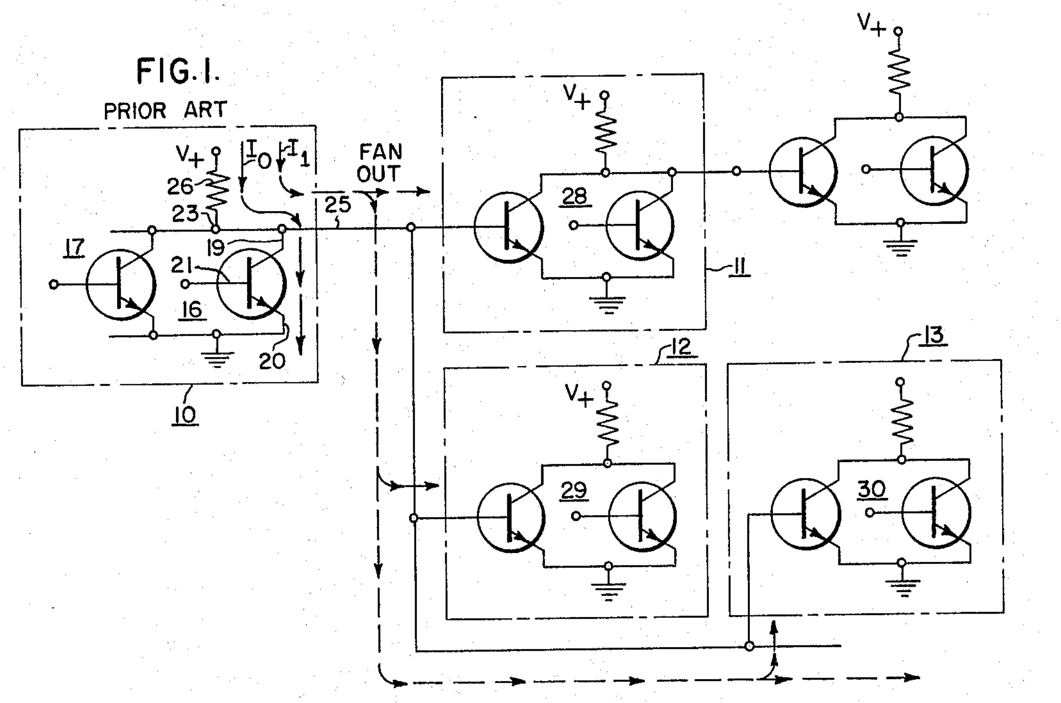
FIG. 1. PRIOR ART
FIGURE 1 illustrates a NOR logic system of the prior art.

FIG. 1 shows a NOR gate 10, the output signal of which, is fed into subsequent NOR logic gates 11, 12 and 13 representing a fan-out of 3, although a greater fan-out could be provided depending upon the design considerations of the system. A NOR gate performs the logic function of providing an output signal when no input signals are present at the inputs of the gate and will provide no output signal when one or more input signals are present. The two voltage extremes at the output are representative of a binary ONE and a binary ZERO where, for example, a more positive voltage may represent a ONE and a ground or near ground voltage represents a ZERO. NOR gate 10 includes a plurality of input transistors of which two, 16 and 17 are shown. A typical transistor 16 includes a collector electrode 19 an emitter electrode 20 and an input, or base electrode 21. The collectors of the transistors are connected together at a common point 23 to which is also connected the output lead means 25. Resistor 26 representing the collector load resistance is operably connected to a source of operating potential $V_+$. If any high input signal is applied to the base of transistors 16 or 17, that particular transistor will conduct. With, for example, transistor 16 turned on and conducting, current $I_0$ flows from $V_+$ through load resistor 26 and through transistor 16 to ground. The voltage at common point 23 (and consequently at the output lead 25) is the collector-emitter voltage of transistor 16, and when conducting, this voltage is very near ground potential and may be in the order of .2 volts for a silicon transistor. The current $I_0$ does not drive any subsequent stages but passes through transistor 16 to ground, serving no useful purpose. This value of current multiplied by the voltage supply $V_+$ causes an unwanted power dissipation and wasted energy. One method of decreasing this power dissipation is to increase the value of resistor 26 thereby reducing the current through it, and, the power dissipation. However, if the available current is reduced, then the minimum current needed to meet fan-out requirements will not be met, and subsequent stages would not respond to the output signals provided by the NOR gate 10.

When ZERO input signals are applied to all of the transistors 16 and 17 of gate 10, the transistors are cut off and the collector voltages rise towards some positive voltage determined by the load connected to output leads 25. Under no load condition the voltage at point 23 rises to the supply voltage $V_+$ and with the load condition as shown in FIG. 1, the voltage at point 23 would rise to approximately the base-emitter voltage drop of subsequent stages, in the order of .6 volts for silicon transistors. The circuit may be designed for higher voltages representing a ONE signal by the inclusion of resistance means or diodes in the base leads of the fan-out transistors 28, 29 and 30. When the voltage at point 23 of gate 10 represents a ONE signal, it would be desirable that the load resistor 26 have a relatively small value to insure a greater current $I_1$ which drives the fan-out transistors 28, 29 and 30. It is therefore seen that for some applications the load resistor 26 should be low to insure a high current for fan-out requirements and in other applications should be high to insure low power dissipation. These conflicting factors are generally resolved by some sort of design compromise.

Figure 2:
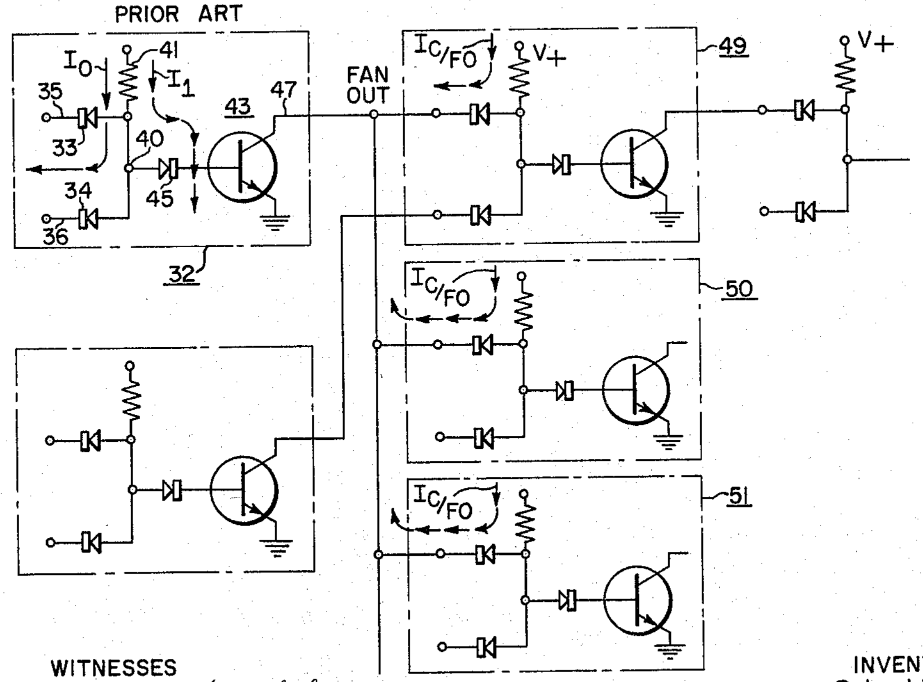
FIG. 2. PRIOR ART
FIG. 2 illustrates a NAND logic system of the prior art.

FIG. 2 illustrates a typical prior art NAND gate configuration. A NAND gate performs the logic function of providing a ONE output signal when any of its input signals are ZERO, and providing a ZERO output signal only when all of its input signals are ONES. A typical NAND gate 32 includes a plurality of input diodes of which two, 33 and 34 are shown. Input signals are applied to input leads 35 and 36 respectively of diodes 33 and 34, the anodes of which are connected to a common point 40. A load resistor 41 is connected to the common point 40 and to a source of operating potential $V_+$. An output transistor 43 is connected to the common point 40 through diode 45. An output lead 47 connected to the collector of transistor 43 provides the input signals to subsequent gates 49, 50 and 51. If a ZERO signal appears on one of the input leads, for example lead 36, diode 34 conducts and the current $I_0$ flows through resistor 41 through diode 34 back to a previous stage. The voltage appearing at point 40 represents a ZERO signal, and in actuality may be equal to the voltage drop across the diode and the $V_{CE}$ (collector-emitter voltage) of a previous stage, the voltage at point 40 being in the order of .8 volt for silicon semiconductor devices. The .8 volt drop across diode 45 is insufficient to turn on transistor 43, the non-conduction thereof representing a ONE signal at the output lead 47. In the case of the NAND gate the current $I_0$ causes an unwanted power dissipation. When all of the input signals to gate 32 are high, diodes 33 and 34 are blocked, the voltage at common point 40 rises and current I will flow from $V_+$ through resistor 41 through the diode 45 and will be the base current of transistor 43. Basically, the larger the base current the larger the collector current and therefore the greater the fan-out capabilities. When base current flows, each of the subsequent gates 49, 50 and 51 provides a portion of the collector current of transistor 43, each portion being designated $I_C/FO$, where $I_C$ represents the collector current of transistor 43 and FO represents the number of fan-outs.

As was the case with respect to the NOR circuit of FIG. 1, a situation is presented wherein for some applications a large current is desired for increasing speed and fan-out capabilities and for other applications a small current is desired for reducing power dissipation. In the present invention a greater fan-out may be provided at reduced power dissipation and at relatively faster speeds and to this end reference is now made to FIG. 3.

Figure 3:
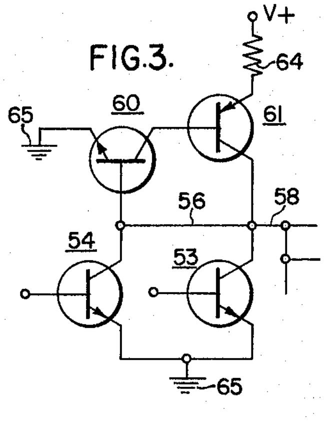
FIG. 3 illustrates an embodiment of the present invention.

FIG. 3 illustrates a NOR gate according to the teachings of the present invention. The gate includes transistors 53 and 54 having their like collector electrodes connected to a common point 56 and are operable to receive bivalued input signals on their base electrode for developing bivalued output signals on output lead means 58 connected to the common point 56.

The voltages appearing at the output lead means of the gates illustrated herein will, in general, depend upon circuit design considerations such as voltage supplies, resistors, types of transistors utilized and to a large extent upon subsequent circuitry receiving the output signals. The term bivalued signals is utilized herein to mean a ZERO signal, which is a low voltage at ground voltage or approximately .2 volt above ground voltage for silicon transistors, and the ONE signal which is the higher voltage, ranging anywhere from approximately .6 volt to the supply voltage, the exact voltage being determined by the circuit and in some cases being represented by any voltage within the range.

In the various embodiments of the present invention described, it is assumed that positive logic will be utilized. The teachings of the present invention are equally applicable to negative logic by rearrangement of transistor types and by connecting the various gates to a source of negative potential as is apparent to those skilled in the art.

In order to regulate the current flow in the gate of FIG. 3 there is provided a current control circuit including a four region p-n-p-n type semiconductor means. This semiconductor means in the circuit of FIG. 3, takes the form of first transistor 60 and second transistor 61 interconnected in a manner best shown in FIG. 4

Figure 4:
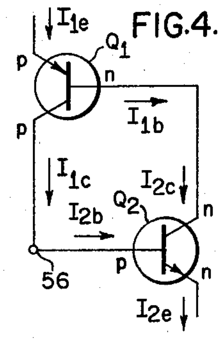
FIG. 4 illustrates an interconnection of transistors to aid in an understanding of the operation of the circuit of FIG. 3.

In FIG. 4 transistors $Q_1$ and $Q_2$ are interconnected such that the base current $I_{2b}$ of $Q_2$ is the collector current $I_{1c}$ of transistor $Q_1$ and the collector current $I_{2c}$ of transistor $Q_2$ is the base current $I_{2b}$ of transistor $Q_1$. Transistor $Q_1$ is a p-n-p type and transistor $Q_2$ is an n-p-n type transistor and it may be seen that the emitter of $Q_1$ forms a first p region, the base of $Q_1$ and the collector of $Q_2$ form an n region, the base of $Q_2$ (connected to the collector of $Q_1$) forms a p region, and the emitter of transistor $Q_2$ forms an n region. It may be mathematically demonstrated that the interconnected transistors of FIG. 4 will operate as a p-n-p-n switch if the common base forward current gain of transistor $Q_1$ and the common base forward current gain of transistor $Q_2$ is equal to or greater than 1, that is $\alpha_{Q1}+\alpha_{Q2}\geqq 1$. Oscillation in an on and off mode may then be obtained with proper voltage applied to the base of $Q_2$ at point 56. A four-layered p-n-p-n switch may be used with proper connections to the intermediate p region.

Referring back to FIG. 3, the first transistor 60 represents transistor $Q_2$ of FIG. 4 and transistor 61 represents $Q_1$. Common point 56 of FIG. 3 is illustrated as 56 in FIG. 4. The emitter of transistor 61 is connected through load resistor 64 to a source of operating potential $V_+$ such that upon conduction a current path is established in the emitter-collector circuit of transistor 61 and the emitter-base current path of transistor 61 is in the collector-emitter current path of transistor 60, the emitter of which may be connected to point of reference potential such as ground 65. In operation, assume that a ONE, or high voltage signal appears at the base of either transistor 53 or 54. The transistor will tend to turn on and the voltage at the collector thereof will be near ground potential. Since common point 56 is connected to the collectors of the input transistors 53 and 54, the common point will also be near ground potential. The base of transistor 60 is connected to the common point 56 and is responsive to the voltage thereat for controlling the conduction and non-conduction of transistor 60. With a ZERO voltage at common point 56 transistor 60 is in a cut-off condition and since there is no collector-emitter current flow, transistor 61 remains in a cut-off condition and substantially all current flow is cut-off. A relatively negligible amount of leakage current does flow when the transistors are in a cut-off condition, however this current, depending upon the circuit parameters, is in the order of nanoamperes and causes negligible power dissipation in the circuit. If both the input signals to the bases of transistors 53 and 54 switch to ZEROS, the collectors, and consequently common point 56, rises in voltage and when a predetermined voltage value is reached, transistor 60 experiencing the higher voltage at its base, will turn on in conjunction with transistor 61 turning on and a current path is established from $V_+$ through resistor 64 through the emitter-base junction of transistor 61 and the collector-emitter current path of transistor 60. Another current path is established through transistor 61 through output lead means 58 where a high current is available to drive a plurality of subsequent stages. Any ONE input signal again appearing at the base of either transistors 53 or 54 will cause the voltage of the common point 56 to drop in value thereby reverting to the no-current condition previously described.

Figure 5:
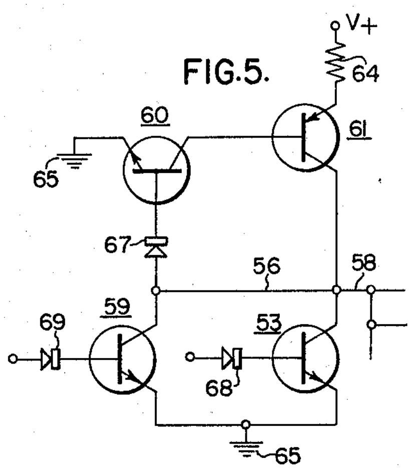
FIG. 5 illustrates a modification of the circuit of FIG. 3.

FIG. 5 illustrates a modification of the NOR circuit of FIG. 3 and like reference numerals indicate like circuit components. The NOR circuit of FIG. 5 operates in the same manner as the NOR circuit of FIG 3 and in addition exhibits higher noise immunity from unwanted signals. Connected between the common point 56 and the base of transistor 60 is a diode 67 poled in the direction of base-emitter current flow. Each of the input semiconductor devices 53 and 54 likewise include an input base diode 68 and 69 respectively. The voltage drop across each of the diodes 67, 68 and 69, when conducting, is approximately .6 volts for a silicon diode. With silicon transistors an on condition will be established when the base-to-emitter diode of the transistor receives a voltage of .6, or in excess of .6 volt. In FIG. 5, with a voltage of approximately .6 appearing at the common point 56, transistor 60 will remain non-conducting since at least .6 of a volt is needed at its base. A voltage of 1.2 volts at the common point 56 will appear after a .6 voltage drop across diode 67, as a voltage of .6 at the base of transistor 60 to cause transistors 60 and 61 to switch to their on condition. In a similar manner any input voltage below 1.2 volts appearing at the anodes of diodes 68 and 69 will not cause transistors 53 or 54 to switch to their on condition, thereby providing the basic circuit protection against extraneous or stray signals which may appear at various points in the circuit which would otherwise cause unwanted triggering of the various transistors.

Figure 6:
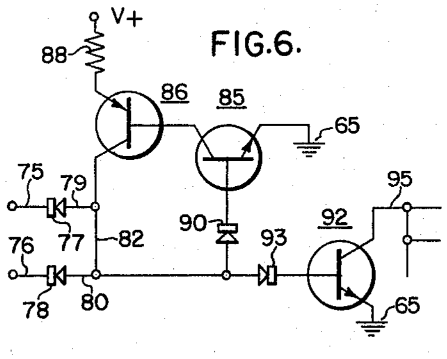
FIGS. 6, 7 and 7A, 8 and 9 illustrate other embodiments of the present invention.

In an analogous fashion to the NOR circuit of FIG. 3, the NAND circuit of FIG. 6 provides bivalued output signals in response to bivalued input signals applied to input electrodes 75 and 76 of input semiconductor diode means 77 and 78 respectively, like anode electrodes of which, 79 and 80, are connected to common point 82. The current control circuit includes first transistor 85 and second transistor 86 operatively connected through a resistor 88 to a source of operating potential $V_+$. The emitter-base current path of transistor 86 is in the collector-emitter path of transistor 85 which has its emitter connected to a point of common reference potential 65 and its base connected to the common point 82 through diode 90. The output means of the NAND gate includes transistor 92 having its base electrode connected to the common point 82 through diode 93 and having output lead means 95 connected to the collector thereof for supplying bivalued output signals to subsequent stages.

The common base forward current gains of transistors 85 and 86 are the same as was demonstrated with respect to the transistors of FIG. 4. When both of the signals appearing on input leads 75 and 76 are ONE, that is, both are high, the voltage at common point 82 rises and when sufficiently high will cause activation of the control circuit including transistor 85 and transistor 86. The voltage must be of sufficient magnitude to overcome the voltage drop across the diode 90 plus the emitter-base voltage drop of transistor 85 and in order for transistor 92 to turn on, the voltage at common point 82 must be of sufficient magnitude to overcome the voltage drop across the diode 93 plus the emitter-base voltage drop across the diode 93 plus the emitter-base voltage drop of transistor 92. With transistor 85 conducting, current flow is established through transistor 86 to the common point 82 through diode 93 to the base of transistor 92 to enable a relatively large collector current to flow and the voltage at the output lead means 95 drops to a ZERO condition at or near ground. If the output lead means 95 is connected to a plurality of similar NAND gates there will be substantially no collector currents in the transistor 92 thereby enormously increasing fan-out capabilities while at the same time reducing or eliminating power dissipation in subsequent stages. This may be illustrated as follows. With the output transistor 92 conducting, output lead means 95 is providing a ZERO signal to a subsequent stage. The operation may be seen by assuming that one or more of the input leads to the NAND gate of FIG. 6 has a ZERO input signal thereon. From ground potential through a transistor of a previous stage providing the ZERO signal and through the input diode to which the zero signal is applied, would produce a voltage at common point 82 of approximately .8 volt assuming silicon semiconductor devices. The voltage at common point 82 is below a predetermined value designed to turn the transistors on, and therefore the transistor 85 will remain in an off condition, as will transistor 86, and substantially no current flow will be experienced. As was the case with respect to FIG. 3, a negligible amount of leakage current is produced. The voltage at common point 82 applied to the anode of diode 93 is insufficient to turn the output transistor 92 to an on condition and the output signal provided on output lead means 95 will be a ONE. It may therefore be seen that when a previous stage is on and is providing a ZERO signal to a subsequent stage, no current will flow through load resistor 88, through transistor 86, through the input diode receiving the ZERO signal and through the collector-emitter path of the output transistor providing the ZERO signal. The circuit of FIG. 6 therefore, provides the NAND function at reduced power dissipation and in addition provides greater fan-out capabilities.

Figure 7:
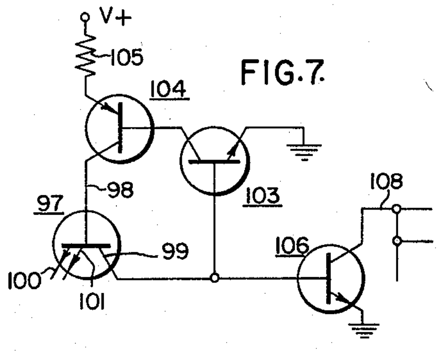
Figure 7A:
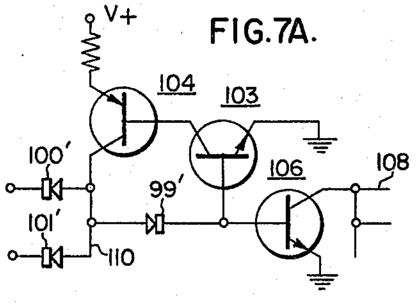

FIG. 7 illustrates another embodiment of the present invention which takes the form of a transistor transistor logic (TTL) NAND gate. The gate includes a multi-emitter transistor 97 having a base electrode 98, a collector electrode 99 and a plurality of emitter electrodes of which two, 100 and 101 are shown. The control circuit includes a first transistor 103 and a second transistor 104 connected in a similar manner as the control transistors 85 and 86 of the NAND gate of FIG. 6. The resistor 105 connects the emitter of transistor 104 to a source of operating potential $V_+$. Output means include output stage transistor 106 having output lead means 108 connected to the collector thereof. Since the base of the transistor 97 in conjunction with the collector 99 forms a p-n diode, and the base in conjunction with the emitters 100 and 101 form p-n diodes, the operation of the circuit may best be illustrated by the equivalent diodes shown in FIG. 7*a*. Diode 100' represents the emitter 100-to-base diode of FIG. 7, diode 101' represents the emitter 101-to-base diode, and diode 99' represents the collector-to-base diode. The anodes of the diodes as well as the collector of transistor 104 are connected to a common point 110. The operation of the circuit is similar to the operation of the NAND gate of FIG. 6 in that when all input signals are ONES, that is all have high voltage values, the voltage at the common point 110 rises and when it is of sufficient magnitude to overcome the voltage drop in diode 99' and the emitter-base voltage drop of transistor 106 and turn on the transistors, transistor 103 will turn on, as will transistor 104, allowing current flow to the base of transistor 106 thereby dropping the voltage on output lead means 108 to its low or ZERO value. If any of the input signals takes on a ZERO value, the voltage at the common point 110 drops below a predetermined value which is insufficient to switch on the transistors and the voltage on output lead means 108 assumes its ONE or high voltage value.

Figure 8:
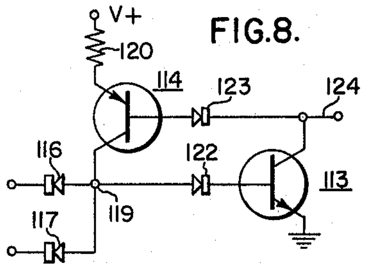

FIG. 8 illustrates another embodiment of a NAND gate in accordance with the teachings of the present invention. It is seen that the NAND gate includes a first transistor 113 and a second transistor 114 interconnected in a manner as shown with respect to FIG. 4. The collector current of transistor 114 is the base current of transistor 113, and the collector current of transistor 113 is the base current of transistor 114. Input semiconductor devices in the form of diodes 116 and 117 are provided for receiving bivalued input signals and have their like, or anode electrodes connected to a common point 119; as is the collector of transistor 114. The emitter of transistor 114 is operatively connected to a source of operating potential $V_+$ through resistor 120. As was stated, the voltage at common point 119 can be as high as .8 volt when one or more ZERO input signals are presented to the input diodes 116 and 117, and this voltage in the absence of diode 122 would be sufficient to cause triggering of transistor 113. Diode 122 therefore is provided in the base circuit to insure that the transistor 113 will not turn on when the voltage at common point 119 is less than 1.2 volts again assuming silicon semiconductor components. In order to balance the .6 voltage drop across the diode 122, there is provided diode 123 in the base circuit of transistor 114 connected to the collector of transistor 113. Output lead means 124 is connected to the collector of transistor 113 for developing bivalued output signals to drive subsequent stages in response to bivalued input signals applied to diodes 116 and 117. When at least one ZERO, signal is applied to the input diodes, the voltage at common point 119 is low, transistor 113 and transistor 114 remain in a cut-off condition and the voltage at the output lead means 124 rises to the supply voltage $V_+$. In the prior art NAND gate, a current flows from the source of operating potential, through the load resistor, and through the diode or diodes receiving the ZERO input signal whereas in the embodiment of the invention shown in FIG. 8, this current is reduced to substantially zero to eliminate any power dissipation when current is not needed. When a ONE, or a high level input signal is applied to both of the input diodes 116 and 117, the voltage at common point 119 rises to a point where transistor 113 and transistor 114 turn on. Since the base current of transistor 113 is the collector current of transistor 114, a relatively large base current is supplied to the transistor 113, and since the collector current of transistor 113 is the base current of transistor 114, a relatively small collector current is supplied and the voltage level on the output lead means 124 reduces to its ZERO, or near ground potential. If the output lead means 124 is connected to an input diode of a subsequent stage or stages that stage, as was demonstrated with respect to a ZERO input signal appearing on diodes 116 or 117, will not supply any current back through the diodes and through the collector circuit of transistor 113.

Figure 9:
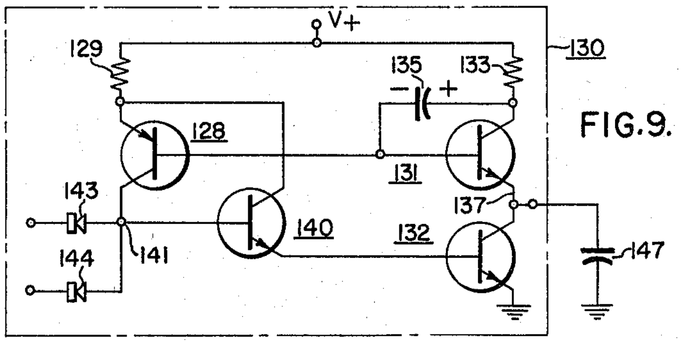

The logic circuit 130 of FIG. 9 is a modification of the NAND gate of FIG. 8 and incorporates the principles of the present invention in a faster operating logic circuit. The NAND gate of FIG. 9 includes a first current path having a first transistor 128 serially connected with resistor 129, one terminal of which is connected to a source of operating potential $V_+$. A second current path includes serially connected second transistor 131 and third transistor 132 with a resistor 133 connected between the source of operating potential $V_+$ and the collector of transistor 131. In essence, the base-to-emitter diode of transistor 131 replaces diode 123 of the circuit of FIG. 8, and the replacement of diode 122 is accomplished by the base-to-emitter diode formed by a fourth transistor 140, the collector of which may be connected to various points in the circuit, the connection in FIG. 9 being to the emitter of transistor 128. Output lead means 137 is connected between the second and third transistors 131 and 132. Means are provided to directly connect the base of transistor 128 to the base of transistor 131. The collector of transistor 128 and the base of transistor 132 are operatively connected to a common junction point 141 the connection of the base of transistor 132 being made through transistor 140. Input diodes 143 and 144 which may be connected in one of the current paths to form either input diodes or output diodes (and consequently the input diodes for subsequent stages) are shown as having their anode electrodes connected to the common point 141, thus constituting input diodes.

The operation of the logic circuit 130 may best be understood by assuming that the NAND gate drives a plurality of subsequent stages which may be represented by the capacitor load 147 connected to the output lead means 137. The specific value of capacitance of the capacitor 147 will of course depend upon the number and nature of the subsequent fan-out stages.

Assuming that the inputs to both diodes 143 and 144 are high, the voltage at the common point 141 will be high and all of the transistors 128, 131, 132, and 140 will be on and in their conducting state. Current flow through resistor 133 charges up capacitor 135 to the polarity as shown and the current in the series circuit including transistors 131 and 132 provides an output signal on output lead means 137 which is the low voltage or ZERO value, being equal to the voltage drop from the collector to emitter of transistor 132. As a design consideration, it is desired that the base current of transistor 128 and consequently the base current of transistor 131 be relatively small so that the collector current of transistor 131 is relatively small. Resistor 133 has a resistance which is much less than the resistor 129 and the transistor 131 collector current flowing through resistor 133 causes a small power dissipation as does the emitter current of transistor 128 flowing through resistor 129. It may be seen that the voltage at output lead 137 is the voltage across the capacitor load 147. During operation this voltage is switched from its low voltage ZERO value to its high voltage ONE value. The change of charge on capacitor 147 is a function of the capacitance, the change in voltage across the capacitor, the value of driving current and the length of time that the driving current is applied. Since the change in voltage across the capacitor is known, and is the difference between a ONE and ZERO value, a desired speed of operation may be chosen and the current required to insure operation at that speed can be determined.

When the transistors are on, the current through resistor 129 divides into a plurality of paths. One of the paths is to the emitter of transistor 128 and the other path is to the collector of transistor 140. The base current of transistor 128 therefore has a certain value, $I_b$, which is the base current of transistor 131. The base current is designed to have a relatively low value so that the collector current of transistor 131, and consequently the current through resistor 133 is relatively small. When the voltage at common point 141 drops, cutting off transistors 140 and 132, the current in resistor 129 no longer divides between two paths but flows solely in the emitter-base diode of transistor 128, the total current representing a much greater $I_b$ and consequently transistor 131 may have a relatively high collector current flow. Aiding this collector current is the previously built-up charge on capacitor 135 which discharges through the collector-emitter current path of transistor 131 to quickly charge up the capacitor load 147 to its other voltage extreme representing a ONE signal. Capacitor 135 serves to increase the speed of operation and may be eliminated if lower speeds can be tolerated since a large current would be supplied to charge up the capacitor load 147 by virtue of the fact that the resistor 133 has a relatively low value and will sustain a large flow of current. When the capacitor load 147 has charged to its high voltage extreme, the voltage at output lead means 137 is of a value such that the previously conducting base-emitter diode of transistor 131 and the emitter-base diode of transistor 128 cease conducting and with a high voltage level representing a ONE output signal at the output lead means 137, substantially no current flows in the circuit of FIG. 9 and the power dissipation is substantially zero. When the gate is again provided with all ONE signals the voltage at common point 141 rises and the self-triggering action causes the transistors to turn on and the circuit reverts to the conditions previously described.

By way of example, a NAND gate circuit in accordance with FIG. 9 may have the following component values.

| | | |
|---|---|---|
| $V_+$ | volts | 2.5 |
| Resistor **129** | kilohms | 4.8 |
| Resistor **133** | ohms | 910 |
| Capacitor **135** | microfarads | 110 |
| Transistor **128** | | (1) |
| Transistor **131** | | 2N708 |
| Transistor **132** | | 2N708 |
| Transistor **140** | | 2N697 |

[1] Low-gain p-n-p transistor.

Typical average gating speeds for a circuit with the above values is in the order of 42 nanoseconds with an average power dissipation of approximately 2 milliwatts when the transistors are on and approximately 0 watts when the transistors are off, representing an average power dissipation of 1 milliwatt with a 50% duty cycle. Obviously other component values may be utilized for providing different operating currents. In general, with increased operating currents both power dissipation and speed of operation is increased and for lower operating currents, the power dissipation and speed of operation are decreased.

Accordingly, there has been shown in the various figures, logic gates in accordance with the present invention which substantially eliminate unwanted and unneeded currents such as $I_0$ in the prior art of FIG. 1 and $I_C/FO$ in the prior art of FIG. 2. The elimination of these currents reduces the power dissipation by approximately one-half for a 50% duty cycle thereby resulting in a greater efficiency and relatively faster speeds for equivalent power dissipation as those circuits of the prior art. The decreased power dissipation, in addition to the complementary symmetry, that is, p-n-p and n-p-n transistors allows microelectronic fabrication otherwise known as integrated circuitry.

Although the present invention has been described with a certain degree of particularity, it should be understood that the present disclosure has been made by way of example and that modifications and variations of the present invention are made possible in the light of the above teachings.

What is claimed is:

1. A circuit comprising:

a plurality of input semiconductor devices each having an input electrode to which input signals are applied and a second electrode, each second electrode being connected to a common point;

control means connected to said common point and responsive to the voltage developed thereat for allowing current flow to said common point when said voltage is above a predetermined value and for substantially cutting off current flow when below said value; and means for connecting said control means to a source of operating potential.

2. A logic circuit comprising:

a plurality of input semiconductor devices each having an input electrode to which bivalued signals are applied and a second electrode, each second electrode being connected to a common point;

a resistor;

a p-n-p-n semiconductor means having a first p region connected to said resistor, a second p region connected to said common point and an n region connected to a point of the reference potential;

means for applying operating potential to said resistor; and output means connected to said second p region.

3. A logic circuit comprising:

a plurality of input semiconductor devices each including an input electrode for receiving bivalued input signals, and an output electrode connected to a common point for developing bivalued signals at said point in response to said input signals;

a first transistor having its base electrode connected to said common point for passing current in its collector-emitter current path when the voltage at said common point exceeds a predetermined value;

a second transistor having its collector connected to said common point and its base-emitter current path in the collector-emitter current path of said first transistor, means for connecting the emitter of said second transistor to a source of operating potential; and output means connected to said common point.

4. A logic circuit comprising:

a plurality of input transistors having their collector-emitter current paths in parallel circuit configuration with their collectors connected together at a common point;

first and second control transistors, the base of said first and one electrode of said second being connected to said common point, the remaining two electrodes of said second transistor being in the collector-emitter current path of said first transistor; and means for applying operating potential to one electrode of said second transistor.

5. A logic circuit comprising:

a plurality of input transistors for receiving input signals on a base electrode thereof and having their emitter electrodes connected to a point of common reference potential and their collector electrodes connected together at a common point;

first and second control transistors, the base of said first and the collector of said second being connected to said common point, the collector of said first being connected to the base of said second, and the emitters of said first and second being respectively connected to a point of common reference potential and a source of operating potential; and output lead means connected to said common point.

6. A logic circuit according to claim 4 including diodes in the base-emitter circuit of the input transistors and a diode connected between the common point and the base of the first transistor.

7. A logic circuit according to claim 4 in which the common base forward current gain of the first transistor plus the common base forward current gain of the second transistor is equal to or greater than 1.

8. A logic circuit comprising:

a plurality of input transistors each having its collector electrode connected to a common point and its emitter electrode connected to a point of common reference potential for developing bivalued signals at said common point in response to bivalued input signals applied to the base electrode of said transistors;

a current control circuit;

said current control circuit including a first transistor having its base electrode connected to said common point for turning on said first transistor when the signal at said point has one of said values and for turning off said transistor when the signal at said point has the other of said values;

said current control circuit additionally including a second transistor having its base electrode connected to the collector electrode of said first transistor for turning on said second transistor when said first transistor turns on;

the collector of said second transistor being connected to said common point for supplying current thereto when said second transistor is on; and means for resistively connecting the emitter of said second transistor to a source of operating potential.

9. A logic circuit comprising:

a plurality of input diodes each having a like electrode connected to a common point;

first and second control transistors, the base of said first and one electrode of said second transistor being connected to said common point, the remaining two electrodes of said second transistor being in the collector-emitter current path of said first transistor;

means for applying operating potential to the electrode of said second transistor not connected to said common point; and output means connected to said common point.

10. A logic circuit comprising:

a plurality of input diodes each having an electrode for receiving bivalued input signals and each having a second and like electrode connected to a common point;

first and second control transistors each having at least one electrode connected to said common point for controlling current flow to said common point in response to the voltage developed at said common point;

means for applying operating potential to an electrode of said second transistor not connected to said common point;

an output transistor having its base connected to said common point for developing output signals at its collector electrode in response to the input signals applied to said input diodes.

11. A logic circuit according to claim 10 which includes a diode connected between the common point and the base electrode of the first transistor and a diode connected between the common point and the base electrode of the output transistor.

12. A logic circuit comprising:

a multi-emitter transistor having a base, collector and a plurality of emitter electrodes;

first and second control transistors, the base of said first being connected to the collector of said multi-emitter transistor, the collector of said second being connected to the base of said multi-emitter transistor, the emitter-base current path of said second transistor being in the collector-emitter current path of said first transistor;

means for resistively connecting the emitter of said second transistor to a source of operating potential;

an output transistor having its base electrode connected to the collector electrode of said multi-emitter transistor; and output lead means connected to the collector electrode of said output transistor.

13. A logic circuit comprising:

a plurality of input diodes each having an input electrode and a second electrode, each said second electrode being connected to a common point;

two transistors interconnected to have the base and collected currents of the first be the collector and base currents respectively of the second transistor;

said common point being connected in one of the current paths between said first and second transistor;

means for applying operating potential to one of said transistors; and output means for sensing the voltage across one of said transistors.

14. A logic circuit comprising:

a plurality of input diodes each having an input electrode for receiving bivalued input signals, and a second electrode, said diodes having their second electrode connected to a common point;

a first transistor and an output transistor;

the collector of said first transistor being connected to said common point, the emitter of said first transistor including means for resistively connecting said emitter to a source of operating potential, and the base of said first transistor being connected to the collector of said second transistor;

the base of said second transistor being connected to said common point and the emitter thereof being connected to a point of reference potential; and output lead means connected to the collector electrode of said output transistor for sensing the voltage thereacross.

15. A logic circuit according to claim 13 which includes a diode connected between the base of the first and the collector of the second transistor, and a diode connected between the common point and the base of said output transistor.

16. A logic circuit comprising:

first and second current paths;

said first current path including a first resistor and a first transistor, said first resistor being serially connected in the emitter-collector current path of said first transistor;

said second current path including a second resistor and a second and third transistor, said resistor and the collector-emitter current paths of said second and third transistors being serially connected;

means connecting the bases of said first and second transistors together;

means connecting the electrode of said first transistor, not connected to said resistor, to the base of said third transistor;

a plurality of diodes each having a like electrode connected to a common point in one of said current paths; and means for applying operating potential to said first and second resistors.

17. A logic circuit comprising:

first and second current paths;

said first current path including a first resistor and a first transistor, said first resistor having one terminal thereof connected to the emitter of said first transistor;

said second current path including a second resistor and a second and third transistor, one terminal of said resistor being connected to the collector of said second transistor, the emitter of said second transistor being connected to the collector of said third transistor, the emitter of which being connected to a point of reference potential;

a fourth transistor;

means connecting the base of said first and second transistors together;

means connecting the collector of said first transistor to the base of said fourth transistor, the collector and emitter of said fourth transistor being connected respectively to the emitter of said first and the base of said third transistor;

a plurality of diodes each having a like electrode connected to a common point in one of said current paths; and means for applying operating potential to the other terminals of said first and second resistors.

18. A logic circuit according to claim 16 in which said second resistor has a value less than that of said first resistor.

19. A logic circuit comprising:

a plurality of input diodes each having an input electrode and a second electrode, each said second electrode being connected to a common point;

a first and second resistor;

first, second, third and fourth transistors, the bases of said first and second transistors being connected together, said first and second resistors being connected in the collector-emitter current path of said first and second transistors respectively, the base of said fourth and the collector-emitter current path of said first transistor being connected to said common point, the collector-emitter current path of said third transistor being in series with the collector-emitter path of said second transistor, and the base of said third transistor being connected to one electrode of said fourth transistor;

means for connecting said first and second resistors to a source of operating potential; and output lead means connected to one electrode of said third transistor.

20. A logic circuit comprising:

first and second current paths;

said first current path including a first resistor and a first transistor, said first resistor being serially connected in the emitter-collector current path of said first transistor;

said second current path including a second resistor and a second and third transistor, said second resistor and the collector-emitter current paths of said second and third transistors being serially connected;

means connecting the bases of said first and second transistors together;

a fourth transistor;

the electrode of said first transistor, not connected to said resistor, being connected to the base of said fourth transistor, the electrode connected to said resistor being connected to the collector of said fourth transistor;

a plurality of diodes each having a like electrode connected to a common point in one of said current paths; and means for applying operating potential to said transistors.

21. A logic circuit according to claim 20 wherein the collector of the second transistor is connected to the second resistor and a capacitor is connected to the base and collector of the second transistor.

References Cited by the Examiner

UNITED STATES PATENTS

| | | | |
|---|---|---|---|
| 2,890,353 | 6/1959 | Van Overbeek et al. | 307—88.5 |
| 2,966,979 | 1/1961 | Zarling | 307—88.5 X |
| 3,121,802 | 2/1964 | Palmer | 307—88.5 |
| 3,151,281 | 9/1964 | Kuehn | 307—88.5 X |

OTHER REFERENCES

De Sautels, The Versatile Transistor NOR Circuit, Control Engineering (magazine), May 1960, pages 101–104.

ARTHUR GAUSS, *Primary Examiner.*

I. C. EDELL, R. H. EPSTEIN, *Assistant Examiners.*